United States Patent
Greason et al.

[19]

[11] Patent Number: 5,939,942
[45] Date of Patent: Aug. 17, 1999

[54] HIGH FREQUENCY INPUT BUFFER

[75] Inventors: Jeffrey K. Greason, Tehachapi; Hemmige D. Varadarajan, Fair Oaks, both of Calif.

[73] Assignee: Intel Corporation, Santa Clara, Calif.

[21] Appl. No.: 08/949,179

[22] Filed: Oct. 10, 1997

[51] Int. Cl.$^6$ ........................................................ H03F 3/45
[52] U.S. Cl. .......................................... 330/253; 330/258
[58] Field of Search ..................................... 330/253, 258, 330/254, 261

[56] References Cited

U.S. PATENT DOCUMENTS

| | | | |
|---|---|---|---|
| 4,496,861 | 1/1985 | Bazes | 307/602 |
| 4,499,428 | 2/1985 | Bazes | 330/10 |
| 4,675,556 | 6/1987 | Bazes | 307/465 |
| 4,849,661 | 7/1989 | Bazes | 307/475 |
| 4,937,476 | 6/1990 | Bazes | 307/475 |
| 4,958,133 | 9/1990 | Bazes | 330/253 |
| 5,703,532 | 12/1997 | Shin et al. | 330/253 |

*Primary Examiner*—Robert Pascal
*Assistant Examiner*—Patricia Nguyen
*Attorney, Agent, or Firm*—Blakely, Sokoloff, Taylor & Zafman

[57] ABSTRACT

A high frequency input buffer within an integrated circuit that is used to receive a signal from another integrated circuit is described. A preamplifier for use in an input buffer of the integrated circuit is described. The preamplifier includes a differential amplifier with differential input terminals and output terminals. An input data signal and an input reference signal are applied to the differential inputs. The differential output signals are generated in response to the differential input signals and are adapted to be applied to the differential input terminals of an amplifier within the input buffer. An adjusting device within the preamplifier adjusts the differential outputs such that they are in a region of optimum gain for the amplifier.

22 Claims, 7 Drawing Sheets

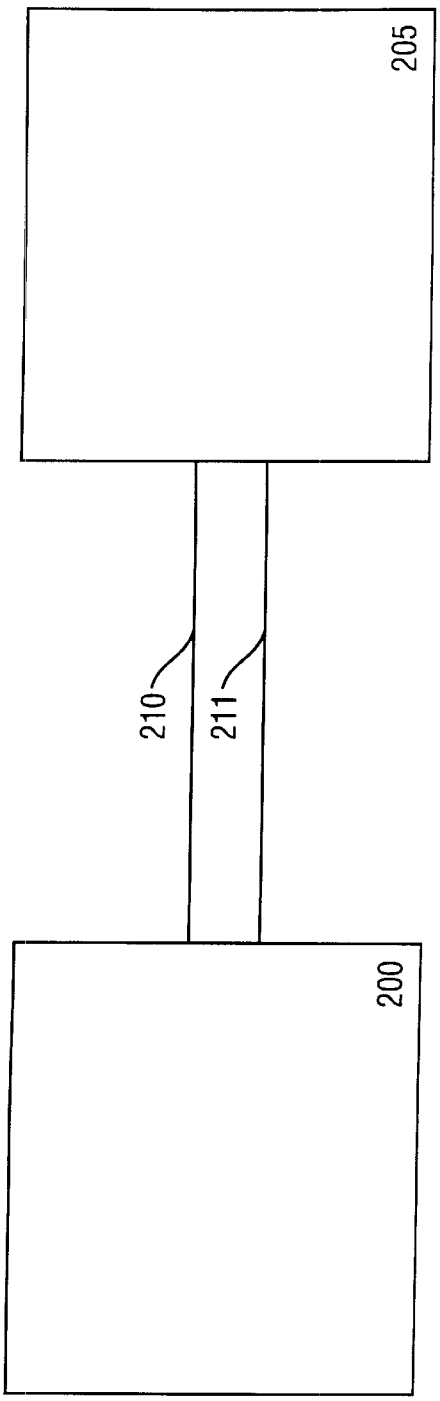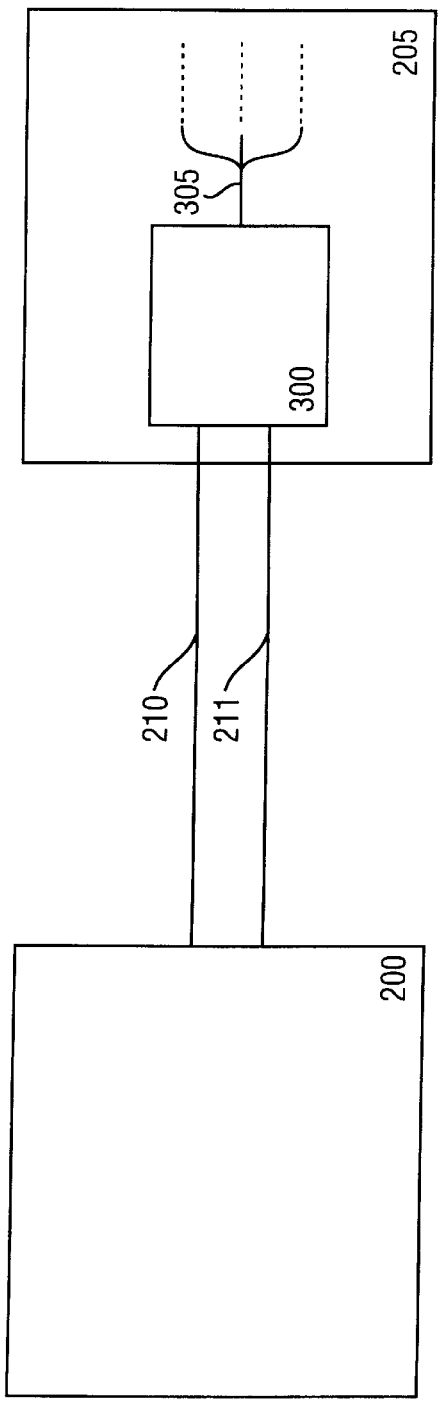

HIGH FREQUENCY INPUT BUFFER

BACKGROUND OF THE INVENTION

1. Field of the Invention

The invention relates in general to the field of integrated circuits, and, more particularly, o signals sent between integrated circuits. Specifically, the invention relates to a high frequency input buffer used to receive a signal from an integrated circuit.

2. Description of the Related Art

Integrated circuits are small electronic devices that are generally made in a semiconductor material and classified by the number of transistors and other electronic components that they contain. Numerous integrated circuits can be used in a simple device, such as a computer, audio equipment, video equipment, etc. With growing complexity of electronic devices, there has been a corresponding growth in the size and complexity of the integrated circuits contained therein. In fact, complex electronic devices, such as computers, now contain millions of transistors arranged into many integrated circuits.

When multiple integrated circuits are being used within one type of device (e.g., a microprocessor), it may become beneficial to have communication (i.e., the sending and receiving of electronic signals) between the circuits. Typically, input buffers are used within the receiving integrated circuit to isolate the input signal from the remainder of the circuit. Conventional input buffers may employ an amplifier with an external feedback mechanism as shown in FIG. 1.

The differential amplifier 100 includes the input terminals 105 and 110 and an output terminal 115. The feedback mechanism for this differential amplifier 100 includes a resistor 120, which is connected external to the differential amplifier 100 between the output terminal 115 another resistor 130 between the negative terminal 125 and the input terminal 110. Conventional external feedback mechanisms may be problematic in that they draw current from or deliver current to a reference voltage. Owing to the large number of connections between integrated circuits, numerous input buffers are often needed within a semiconductor device. Due to the large number of input buffers connected to the reference voltage, the reference voltage may be altered.

Additionally, conventional input buffers have a preamplifier with a single output resulting in difficulty with amplifying small signals (e.g., 50 mV) to generate full swing (e.g., 1.5 V) high-frequency output signals (e.g., 800 Mhz) in the presence of noise.

Thus, it would be beneficial to have a high-frequency input buffer that is capable of overcoming the shortcomings of conventional methods.

SUMMARY OF THE INVENTION

The invention relates to a high-frequency input buffer within an integrated circuit that is used to receive a signal from another integrated circuit. A preamplifier for use in an input buffer of the integrated circuit is described. The preamplifier includes a differential amplifier with differential input terminals and output terminals. An input data signal and an input reference signal are applied to the differential input terminals. The differential output signals are generated in response to the differential input signals and are adapted to be applied to the differential input terminals of another amplifier within the input buffer. An adjusting device within the preamplifier adjusts the differential output terminals such that they are in a region of optimum gain for the amplifier.

BRIEF DESCRIPTION OF THE DRAWINGS

Other objects and advantages of the invention will become apparent upon reading the following detailed description and upon reference to the drawings in which:

FIG. 2 illustrates connections between two integrated circuits;

FIG. 3 shows an integrated circuit with an input buffer;

Figure 1:
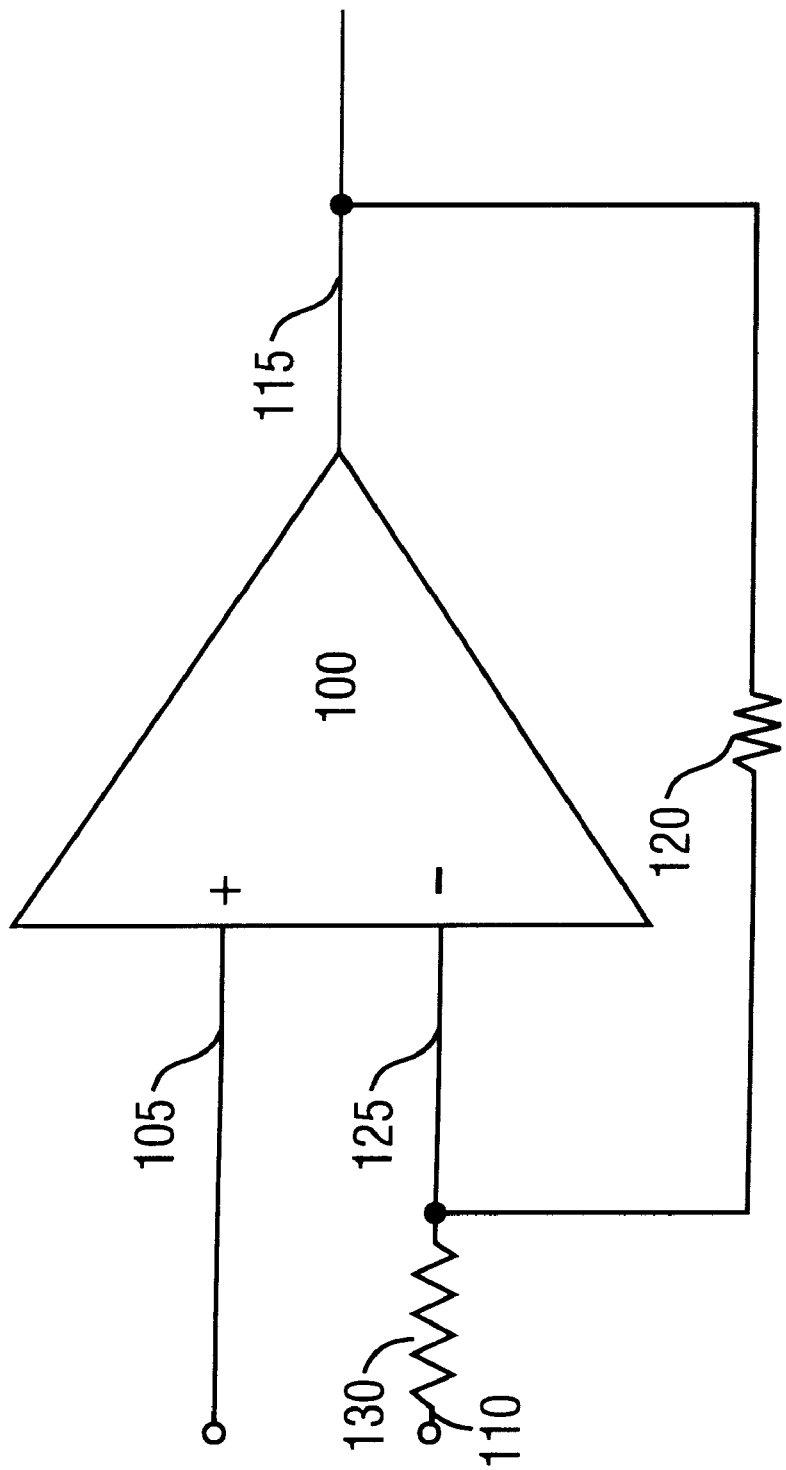
FIG. 1 depicts a conventional feedback mechanism used with a conventional differential amplifier.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below as they might be employed in a high frequency input buffer for an integrated circuit. In the interest of conciseness, not all features of an actual implementation are described in this specification. It will of course be appreciated that in the development of any actual embodiment, numerous implementation-specific decisions must be made to achieve the developer's specific goals, such as compliance with system-related and business-related constraints. Moreover, it will be appreciated that even if such a development effort might be complex and time-consuming, it would nevertheless be a routine undertaking for one of ordinary skill having the benefit of this disclosure.

Overview

FIG. 2 illustrates first and second integrated circuits 200 and 205 in which information is sent along lines 210 and 211. Signals within the integrated circuit 200 may have noise associated with them. Common-mode noise is the noise that occurs within an integrated circuit, for example, as a result of process, temperature, and voltage supply variations. Typically, the power and ground supplies are both varying "bouncing" up and down in phase (i.e., with the same magnitude and at the same time). Non-common-mode noise may also be present within an integrated circuit. For this type of noise, the power and ground supplies are not bouncing in phase. Non-common-mode noise is often minimized by decoupling capacitance, while the intrinsic nature of common-mode noise has made it more difficult to reduce and more readily accepted.

Generally, common-mode noise becomes an issue when signals are generated within one integrated circuit and are to be used in a different integrated circuit. The common-mode noise within the integrated circuit 205 is normally different, in either magnitude or phase, from the common-mode noise within the integrated circuit 200. This difference in common-mode noise is problematic in that the integrated circuit 205 may recognize the signals as a different signal due to the difference in the common-mode noise. To reduce the differences between the common-mode noise, a corresponding input reference signal may be applied to the line 211 for comparison with the input data signal on the line 210. The input reference signal sent along the line 211 is generally centered between the extremes (i.e., the high and low) of the input data signal sent along the line 210. To reduce the amount of common-mode noise within a signal, some integrated circuits may generate "small signal" data signals. Small signal, as defined in this application, refers to a digital signal whose maximum value is considerably less than the voltage $V_{CC}$ (e.g., 750 mV) and whose minimum value is considerably more than the voltage $V_{SS}$ (e.g., 450 mV).

FIG. 3 illustrates an input buffer 300 within the integrated circuit 205. The input buffer 300 receives both of the signals sent along the lines 210 and 211 from the integrated circuit 200. The input buffer 300 is used to compare the voltage between the input data signal and the input reference signal to generate an amplified output signal that can be sent to different locations within the integrated circuit 205 on a line 305. The generated output signal is a full-swing (i.e., the extremes are equal to $V_{CC}$ and $V_{SS}$) digital signal logically equivalent to the input data signal that was sent along the line 210 despite the difference in the common-mode noise of the integrated circuits 200 and 205.

Figure 4:
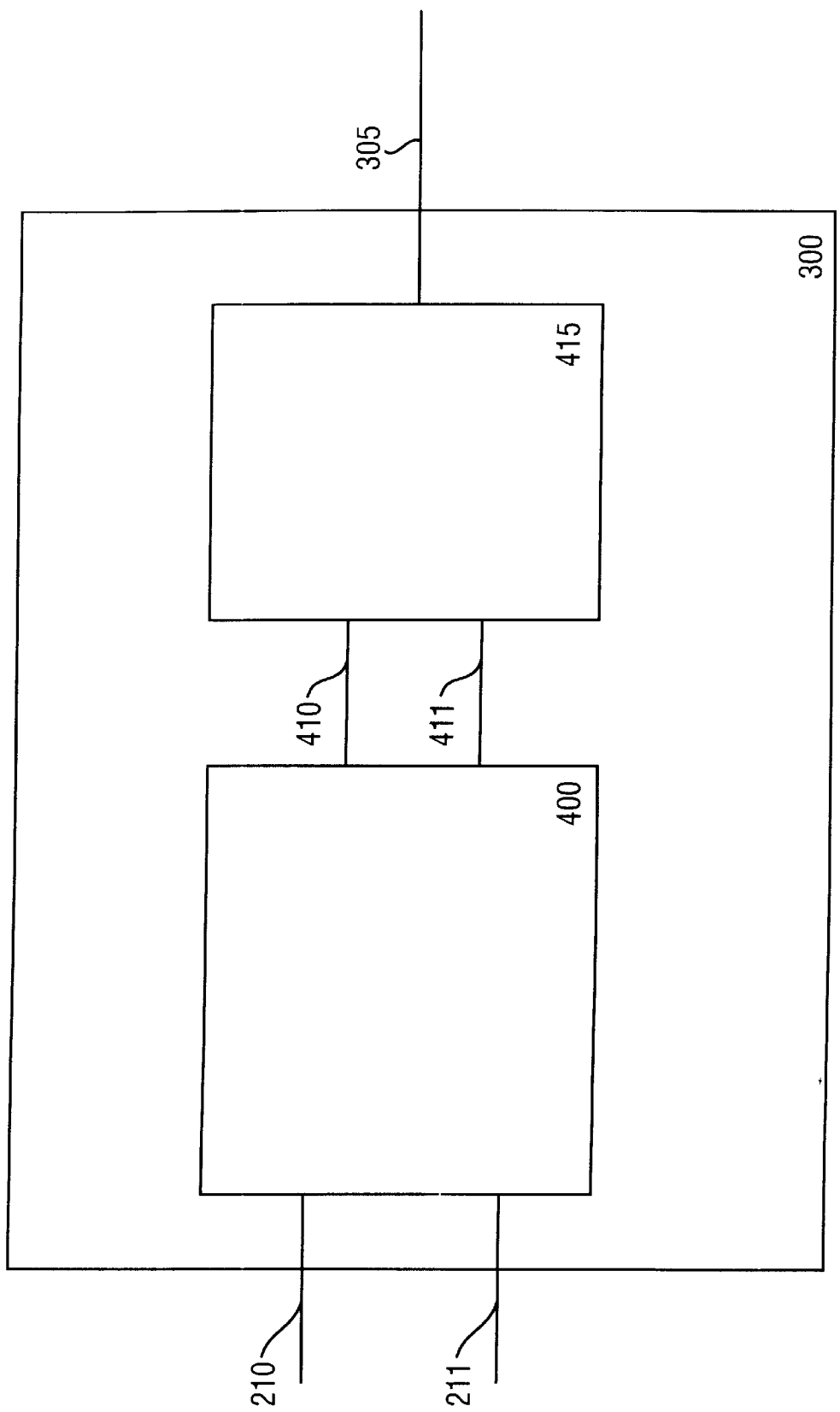
FIG. 4 shows the two stages of an input buffer.

The input buffer 300 may contain multiple stages, as shown in FIG. 4. A preamplifier stage 400 is used to receive the input data and reference signals over the lines 210, 211 (i.e., the signals sent from the integrated circuit 200) and generate corresponding output signals on the lines 410 and 411, which are coupled to an amplifying stage 415. The amplifier 415 may be used to generate the full-swing digital output signal that is to be sent along the line 305 throughout the integrated circuit 205.

Metal Oxide Semiconductor (MOS) transistors are designated as being "off" in the art when very little current is flowing between the drain and source terminals of the transistors. MOS transistors can be turned "on" by applying a voltage to a gate terminal, which will cause a larger amount of current flow. NMOS transistors are turned "on" when a "high" voltage level is applied to the gate terminal, while PMOS transistors are turned "on" when a "low" voltage level is applied to the gate terminal. A high voltage level, as defined in this application, is a voltage level that is greater than a designated reference voltage (e.g., $V_{CC}/2$), while a low voltage level is one that is less than the designated reference voltage. When a node has a high voltage level applied to it, it is generally designated as being in a "high" state. A node is designated as being in a "low" state when a low voltage level is applied to the node.

Figure 5:
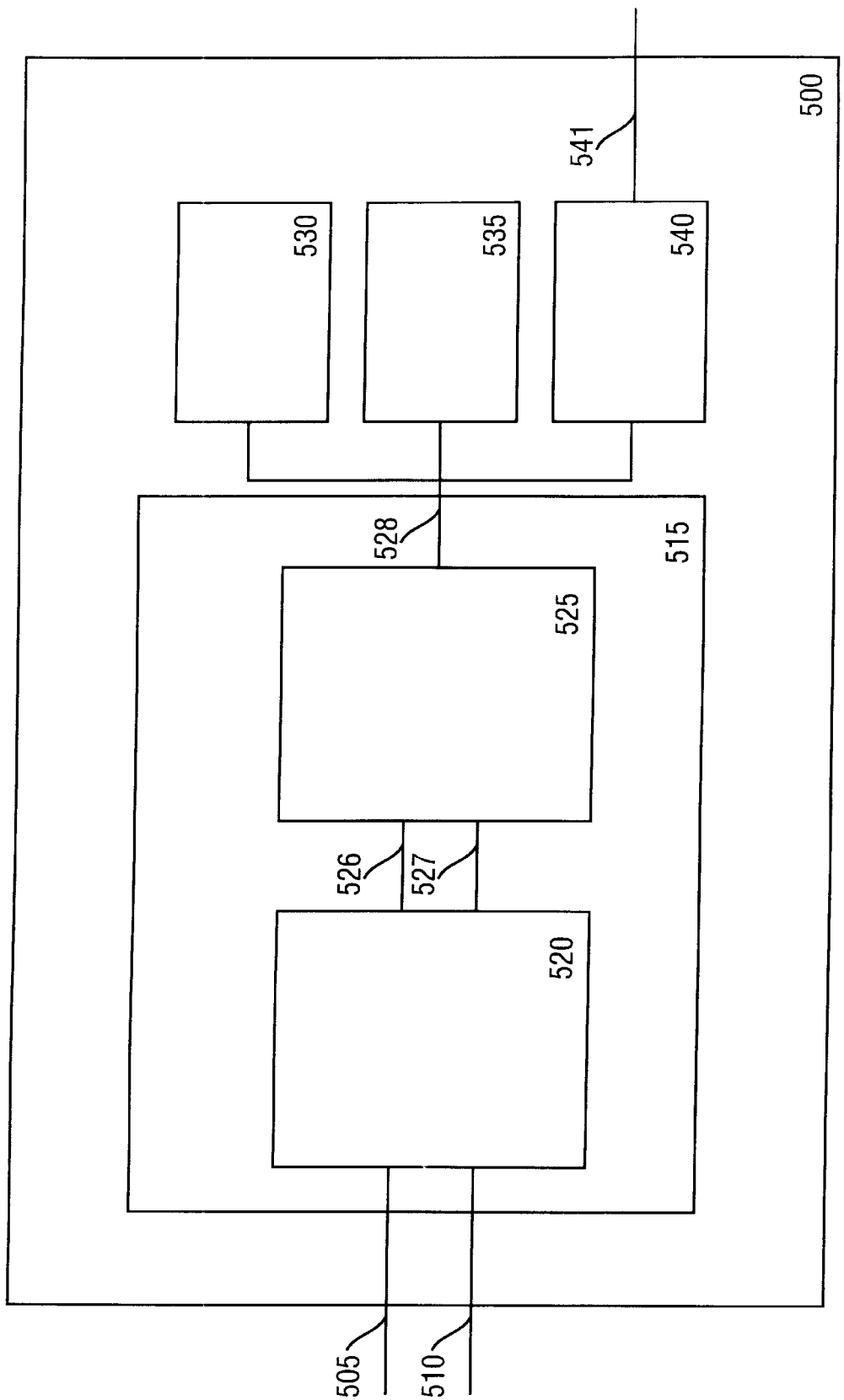
FIG. 5 is a simplified circuit diagram for an integrated circuit according to this invention.

FIG. 5 illustrates a receiving integrated circuit 500, in accordance with the invention, which is receiving small signals sent along lines 505 and 510 from an integrated circuit (not shown). The integrated circuit 500 includes an input buffer 515, which has a preamplifier 520 and an amplifier 525 connected by lines 526 and 527. An output signal is generated in the amplifier 525 and applied to a line 528. The output signal may be routed to several locations within the integrated circuit 500. The circuit 540 may generate a second output signal on the line 541 that is to be sent to another integrated circuit (not shown).

Specific Embodiments

Figure 6:
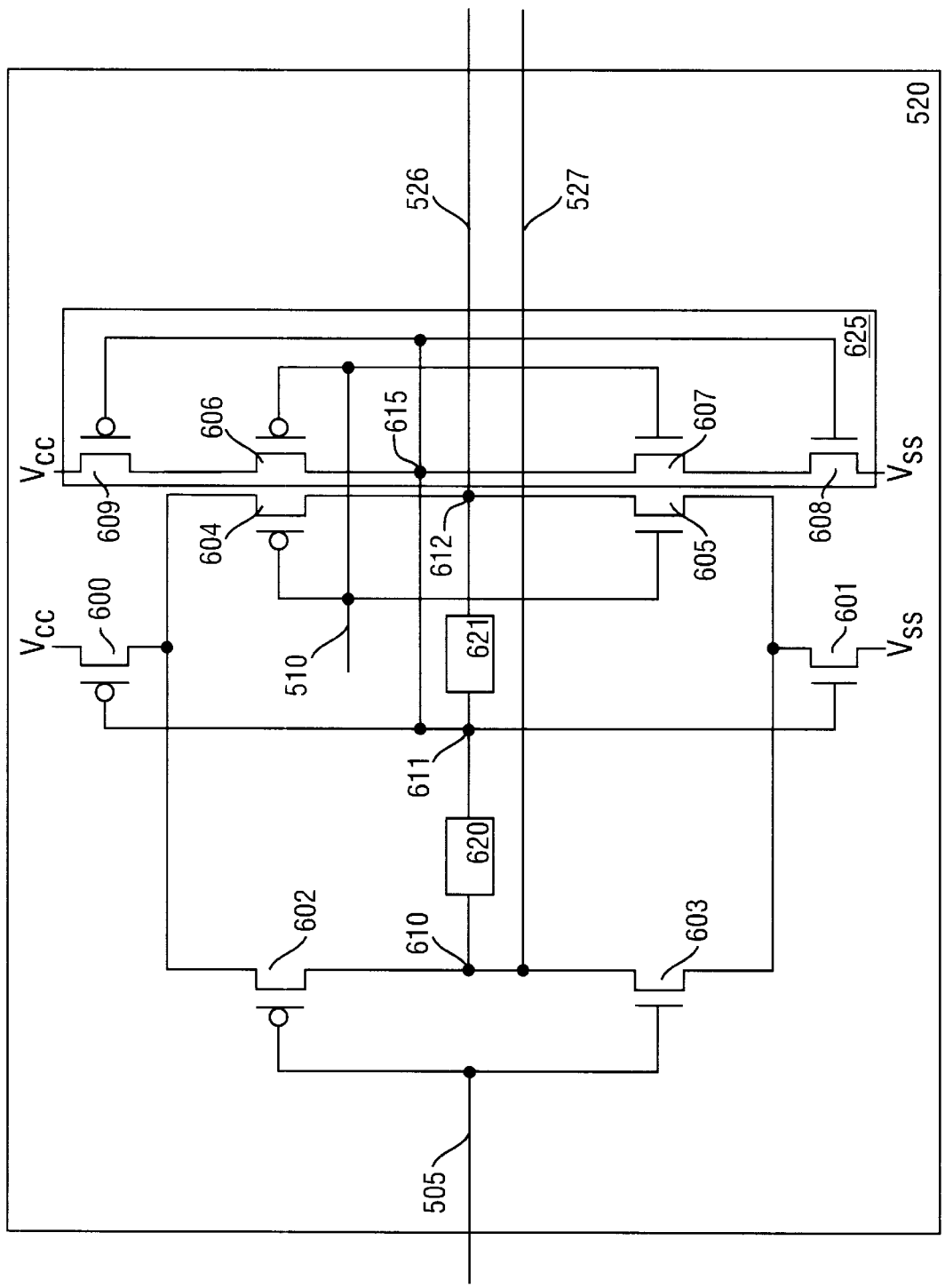
FIG. 6 is a detailed circuit diagram of the preamplifier stage of an input buffer according to this invention.

FIG. 6 is a circuit diagram for the preamplifier 520 which receives the input data signal on the line 505 and the input reference signal on the line 510. As previously mentioned, the input data signal is a small signal data signal. A pair of transistors 600 and 601 have their gate terminals coupled together and essentially function as current sources. The gate terminals of the transistors 600, 601 are connected such that if a high voltage level is applied to them, the transistor 600 reduces the current from the $V_{CC}$ voltage supply. In contrast, the transistor 601 increases the current sent to the $V_{SS}$ voltage supply.

A group of transistors 602–605 form a differential amplifier with differential output terminals 526, 527 which use the transistors 600 and 601 as current sources. Differential output terminals/input terminals are generally defined in the art as the output terminals between which a voltage is measured. The lines 505 and 510 are the differential input terminals, and the lines 526 and 527 are the differential output terminals. The output signal on the line 527 is the logical inverse of the output signal on the line 526. The differential amplifier essentially generates the two output signals by taking the difference between the input signals.

One skilled in the art will appreciate that the transistors 602–603, 604–605, and 606–607 are also configured as inverters. An inverter, as defined in this application, refers to a device that takes an input signal in one logic state and generates the logical inverse of that state as the output signal. Inverters have a "trip voltage" that corresponds to the voltage level of the input signal that is needed to change the state of an output signal. Typically, the "trip voltage" of an inverter is approximately $V_{CC}/2$ if it is uninfluenced (i.e., has a simple input terminal and a simple output terminal). The dimensions of the transistors 602–607 have been adjusted such that the trip voltage for each of the inverter pairs is approximately the same.

The input data signal on the line 505 has both a logically "high" state and a logically "low" state that is generally centered around the input reference signal on the line 510. When the input data signal is applied to the gate terminals of the transistors 602 and 603, one of the transistors begins to conduct more current than the other. For example, if the input data signal is logically "high," the transistor 603 conducts more current, while the transistor 602 conducts less current. The conduction of more current through the transistor 603 generates a low voltage level at the node 610. The relatively low voltage level at the node 610 causes a low output signal to be applied to the line 527. The output signal on the line 527 is designated as the inverted output signal.

Generally, the input reference signal on the line 510 is a mid-level voltage since it has a voltage level approximately halfway between a designated high voltage and a designated low voltage. If the "trip voltage" of the inverter pairs 604–605 and 606–607 are adjusted such that they are approximately equal to the voltage of the input reference signal, the pairs of transistors 604–605, 606–607 would always conduct current. The sizes of the NMOS transistors 605 and 607 can be selected such that they conduct more current than their PMOS counterparts, the transistors 604 and 606. If a logically "high" state is applied to the input reference line 510, a logically low state is applied to the output terminal of the inverter pairs (i.e., the nodes 612 and 615). The voltage level at the node 612 is applied to the line 526 and designated as the output signal.

Figure 7A:
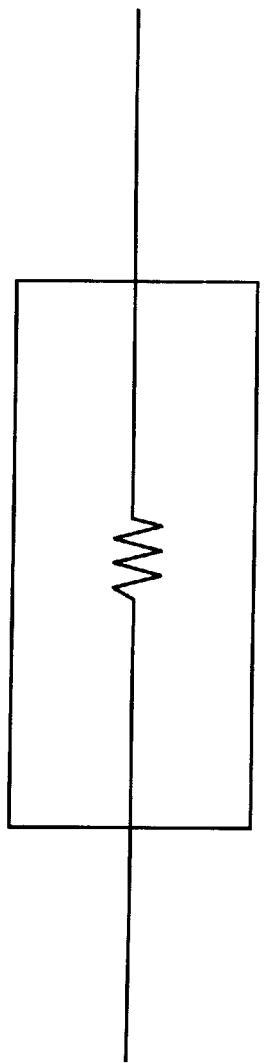
FIGS. 7A–7C show resistive devices that can be used with the preamplifier of FIG. 6.
Figure 7C:
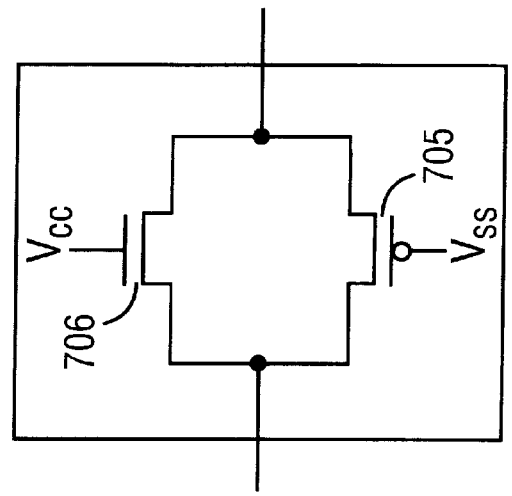
Figure 7B:
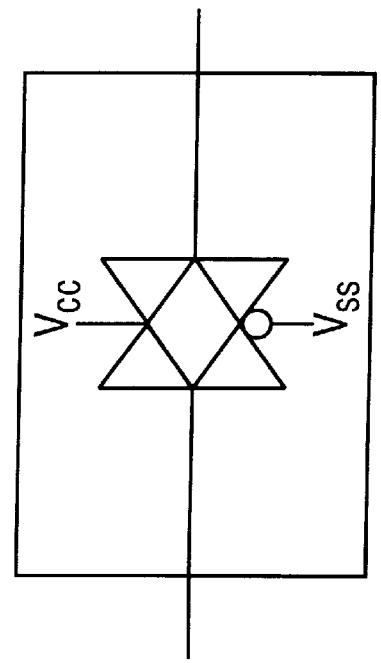

The node 615 is connected to the node 611. The voltage level at the node 611 is designated as the bias voltage. The bias voltage, as defined in this application, is the voltage level at which a constant direct current in the source is established. The two transistor pairs 606–607, 608–609 may also be referred to as a bias generator 625. Since the bias generator 625 is connected to the node 611, which has the bias voltage applied to it, the output terminal of the inverter pair 606–607 sets the bias voltage for the circuit 520. Resistive devices 620 and 621 essentially function to allow the bias voltage at node 611 to be different from the output and inverted voltages at the nodes 612 and 610, respectively. FIGS. 7A and 7B illustrate possible resistive devices 620, 621 that could be used in conjunction with the circuit 520. FIG. 7A illustrates a resistor and FIG. 7B illustrates a transmission gate. One possible implementation of the transmission gate is shown in FIG. 7C, which includes a PMOS and an NMOS transistor 705, 706, whose sources and drains are coupled.

Because the input signal of the inverter pair 606–607 is the input reference signal and the output signal has a voltage equal to the bias voltage, changes in the input reference signal result in a corresponding change in the bias voltage. Thus, the bias voltage can be used to adjust the trip voltage of the inverter pair 604–605 to match the voltage level of the input reference signal. When the trip voltage of the inverter pair 604–605 is approximately equal to the input reference signal voltage, the preamplifier is biased in the region of maximum gain.

Figure 8:
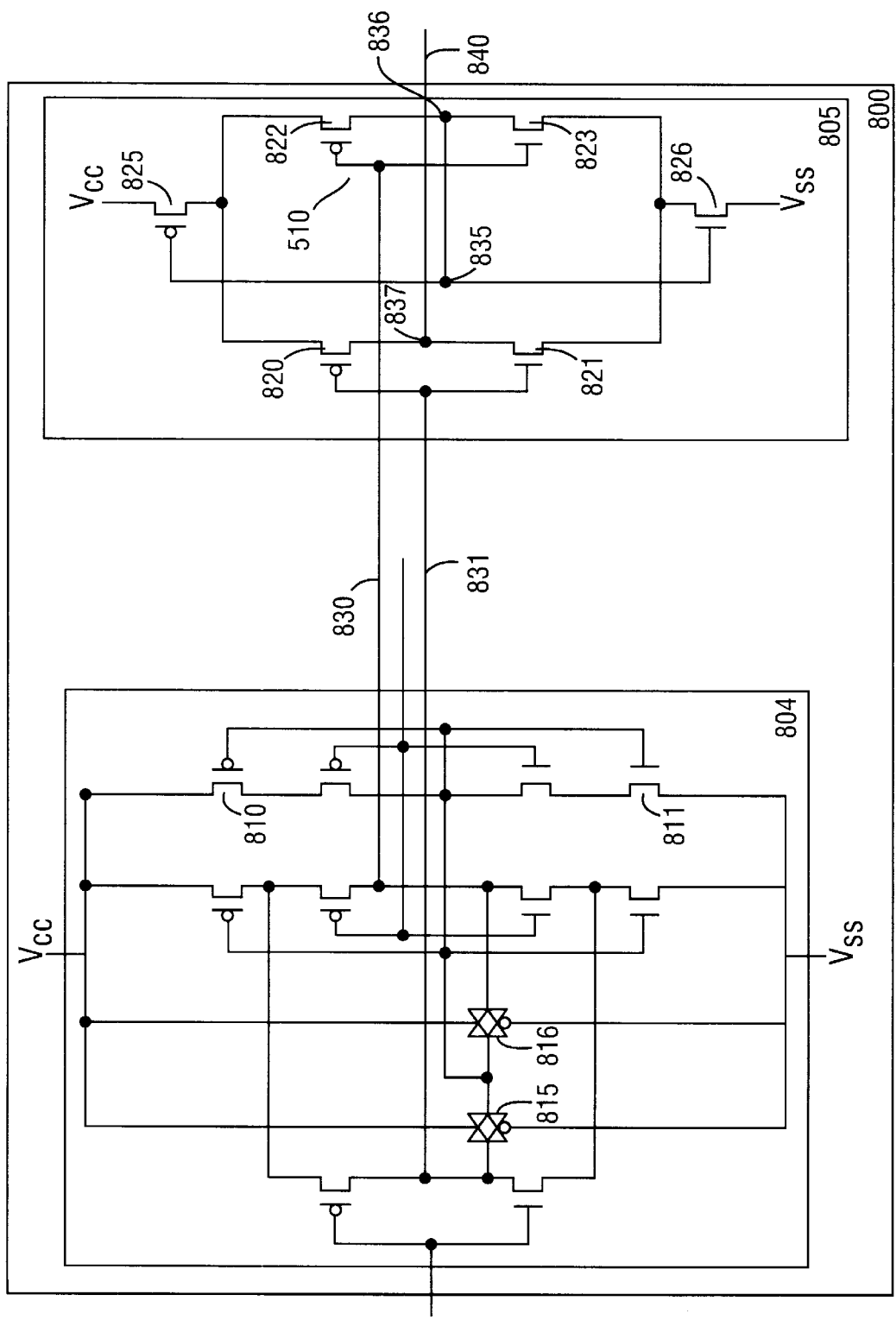
FIG. 8 is a circuit diagram for an embodiment of an input buffer in accordance with the present invention.

An alternative embodiment of the input buffer 515 is shown in FIG. 8. The preamplifier 804 is similar in construction and operation to the preamplifier 520 of FIG. 6. In the preamplifier 804, the transistors 810 and 811 to function as current sources, and transmission gates 815 and 816 are used instead of the resistive devices 620 and 621 of FIG. 6. The amplifier 805 includes two inverter pairs consisting of the transistors 820–821 and 822–823. The transistors 825 and 826 function as current sources as previously described. The input signals to the amplifier 805 are received along the lines 830 and 831. The inverter pair formed from the transistors 822 and 823 function essentially the same as the transistors 606 and 607 of FIG. 6. The bias voltage at the node 835 is coupled to the output node 836 of the inverter pair 822–823. Additional details regarding this amplifier 805 may be found in U.S. Pat. No. 4,849,661 issued to Mel Bazes on Jul. 18, 1989.

The amplifier output voltage is applied at the node 837 and sent along the line 840 to other components. The bias voltage present at the node 835 of the amplifier 805 is dependent on the state of the line 830 coupled to the inverter pair 822–823 which is the output signal of the preamplifier 804. As previously mentioned, the output signal of the preamplifier 804 depends on the voltage of the input reference signal. Thus, there is a "tracking" nature that is inherent within the input buffer 800, which results from the structural similarities and the device sizes. One skilled in the art will appreciate that the tracking nature between the two stages 804, 805 can enable the output signal applied to the line 840 to become essentially a full-swing digital signal with a maximum value approximately equal to $V_{CC}$ and a minimum value approximately equal to $V_{SS}$. Though the input signal sent to the input buffer 800 is a "small" digital signal, the output signal is a full-scale digital signal that can be sent to any type of conventional CMOS device. Other embodiments will result from using other types of conventional amplifiers (e.g., a canonical amplifier) in place of the amplifier 805 in the input buffer 800. In addition, the MOS transistors of FIGS. 6 and 8 could be replaced with junction field effect transistors (JFETs) or bipolar junction transistors (BJTs). One skilled in the art will appreciate that the connections to the gate, drain, and source terminals of an MOS transistor could be replaced by connections to base, collector, and emitter terminals of bipolar transistors.

An input buffer in accordance with the invention presents several advantages over conventional input buffers, such as an enlarged bandwidth for the preamplifier stage. The larger bandwidth allows better amplification of signals over a larger frequency range. When integrated circuits are implemented in microprocessors, the amplification ability of the input buffer can influence frequency of the generated output signal. Consequently, high frequency input buffers can be used to increase the frequency of the generated output signal, which when used in microprocessors corresponds to an increase in the data transfer rate. For example, an input buffer in accordance with the invention can generate an output signal with a frequency of at least 800 Mhz. For a high frequency data signal (i.e., a data signal in which the number of zeros equal the number of ones), an 800 Mhz data signal corresponds to 800 million ones and 800 million zeros. This corresponds to a data transfer rate of 1.6 Gbits/s which is considerably higher than the data transfer rates of conventional input buffers which is less than or equal to 0.8 Gbits/s. A high frequency input buffer in accordance with the invention has a larger bandwidth enabling higher frequency signals to be effectively amplified.

The larger bandwidth also reduces the likelihood of intersymbol interference. Intersymbol interference can cause signals to be generated in which the "true" extremes become indistinguishable. The present input buffer is also fully differential which allows the output terminals from the preamplifier to be adjusted within a region of high gain for the amplifier stage. The feedback mechanism within the present invention is also inside the preamplifier thereby overcoming some of the problems of conventional feedback mechanisms. Finally, the present invention does not require excessive amounts of power or current and drastically increases the data transfer rate because of the doubling of the gain. The invention is also adaptable to telecommunication circuits, microprocessors, chipsets, and memory devices.

It will be appreciated by those of ordinary skill in the art having the benefit of this disclosure that numerous variations from the foregoing illustration will be possible without departing from the inventive concept described herein. Accordingly, it is the claims set forth below, and not merely the foregoing illustration, which are intended to define the exclusive rights of the invention.

What is claimed is:

1. A preamplifier, comprising:
   a differential amplifier having data signal and reference signal input terminals and first and second differential output terminals;
   a first current source coupled to the differential amplifier and adapted to be coupled to a first voltage supply;
   a second current source having an input terminal coupled to an input terminal of the first current source, the second current source coupled to the differential amplifier and adapted to be coupled to a second voltage supply; and
   an adjusting device having an input terminal coupled to the first and second differential output terminals and the input terminals of the first and second current sources, the adjusting device operable to vary the voltage applied to the input terminals of the first and second current sources in response to a voltage applied to the reference signal input terminal.

2. The preamplifier of claim 1 wherein the adjusting device further comprises:

two serially connected transistors having input terminals coupled together and adapted to be coupled to a reference voltage, the transistors being coupled to a third and fourth current source; and two serially connected resistive devices coupled between the differential outputs, a junction of the two resistors being coupled to a junction of the serially connected transistors and to the input terminals of the first and second current sources.

3. The preamplifier of claim 2 wherein an input data signal is connected to the first differential input and an input reference signal is connected to the second differential input.

4. The preamplifier of claim 2 wherein the transistors are selected from the group of transistors consisting of MOS, JFET, and bipolar transistors.

5. The preamplifier of claim 2 wherein the resistive devices are transmission gates.

6. The preamplifier of claim 1 wherein the first current source is an NMOS transistor and the second current source is a PMOS transistor.

7. A preamplifier, comprising:

first, second, third and fourth current source transistors, the first and third current source transistors having a source adapted to be coupled to a first voltage supply, the second and fourth current source transistors having a source adapted to be coupled to a second voltage supply, said first and second current source transistors having gates coupled together, said third and fourth current source transistors having gates coupled together;

first and second input transistors, the first input transistor having a source coupled to a drain of the first current source transistor, the second input transistor having a drain coupled to a drain of the first input transistor, a source coupled to a drain of the second current source transistor, and a gate coupled to a gate of the first input transistor and adapted to receive a data input signal;

first and second reference transistors, the first reference transistor having a source coupled to the drain of the first current source transistor, the second reference transistor having a drain coupled to a drain of the first reference transistor, a source coupled to the drain of the second current source transistor, and a gate coupled to a gate of the first reference transistor and adapted to be coupled to a reference voltage; and means for adjusting gain having a first terminal coupled to the drain of the third current source transistor, a second terminal coupled to the drain of the fourth current source transistor, a third terminal coupled to the gates of the third and fourth current source transistors, said means controlling a voltage line applied to the gates of the first and second current source transistors.

8. The preamplifier of claim 7 including a first resistive element coupled between a junction of the first and second reference transistors and the gates of the first and second current source transistors, and a second resistive element coupled between a junction of the first and second input transistors and the gates of the first and second current source transistors.

9. The preamplifier of claim 8 wherein the resistive devices are transmission gates.

10. A preamplifier, comprising:

PMOS and NMOS current source transistors, the PMOS current source transistor having Is a source adapted to be coupled to a reference voltage supply, the NMOS current source transistor having a source adapted to be coupled to a ground voltage supply and a gate coupled to a gate of the PMOS current source transistor;

PMOS and NMOS input transistors, the PMOS input transistor having a source coupled to a drain of the PMOS current source transistor, the NMOS input transistor having a drain coupled to a drain of the PMOS input transistor and a gate coupled to a gate of the PMOS input transistor;

PMOS and NMOS reference transistors, the PMOS reference transistor having a source coupled to the drain of the PMOS current source transistor, the NMOS reference transistor having a drain coupled to a drain of the PMOS reference transistor and a gate coupled to a gate of the PMOS reference transistor;

first and second resistors, the first resistor having a first end coupled to the drain of the PMOS bias transistor and a second end coupled to a first end of the second resistor, the second resistor having the first end coupled to the second end of the first resistor and the gate of the PMOS current source, and a second end coupled to the drain of the PMOS reference transistor; and PMOS and NMOS bias transistors, the PMOS bias transistor having a source coupled to the drain of the PMOS current source transistor and a drain coupled to the second end of the first resistor, the NMOS bias transistor having a source coupled to the second end of the first resistor and a drain coupled to the drain of the NMOS current transistor.

11. The preamplifier of claim 10 wherein an input data signal is connected to the gate of the PMOS input transistor.

12. The preamplifier of claim 11 wherein an input reference signal is connected to the gate of the PMOS reference transistor.

13. The preamplifier of claim 12 wherein a first output signal is generated at the first end of the first resistor and a second output signal is generated at the second end of the second resistor.

14. The preamplifier of claim 13 wherein a bias voltage is generated at the second end of the first resistor.

15. A high-frequency input buffer comprising:

an amplifier; and a preamplifier, having a differential amplifier having first and second differential input terminals and first and second differential output terminals; a first current source coupled to the differential amplifier and adapted to be coupled to a first voltage supply; a second current source having an input terminal coupled to an input terminal of the first current source, the second current source coupled to the differential amplifier and adapted to be coupled to a second voltage supply; and an adjusting device having terminal coupled to the first and second differential output terminals and the input terminals of the first and second current sources;

wherein the adjusting device is operable to vary the voltage applied to the input terminals of the first and second current sources in response to a reference voltage.

16. The input buffer of claim 15 wherein the amplifier further comprises a differential amplifier having first and second differential input terminals coupled to the differential output terminals of the preamplifier and an output terminal; a third current source coupled to the differential amplifier and adapted to be coupled to the first voltage supply; a fourth current source having an input terminal coupled to an input terminal of the third current source, the fourth current source being coupled to the differential amplifier and adapted to be coupled to the second voltage supply; and an adjusting device having a first terminal coupled to the input terminals of the third and fourth current sources.

17. The input buffer of claim 15 wherein the the adjusting device further comprises:

two serially connected transistors having input terminals coupled together and adapted to be coupled to a reference voltage, the transistors being coupled to a third and fourth current source; and two serially connected resistive devices coupled between the differential outputs, a junction of the two resistors being coupled to a junction of the serially connected transistors and to the input terminals of the first and second current sources.

18. The input buffer of claim 17 wherein an input data signal is connected to the first differential input and an input reference signal is connected to the second differential input terminal.

19. A preamplifier, comprising:

a first PMOS transistor having an output terminal adapted to be coupled to a reference voltage supply voltage;

a second PMOS transistor having an output terminal coupled to the input terminal of the first PMOS transistor;

a first NMOS transistor having an input terminal coupled to the input terminal of the second PMOS transistor and a gate terminal coupled to a gate terminal of the second PMOS transistor;

a second NMOS transistor having an input terminal coupled to the output of the first NMOS transistor, a gate terminal coupled to a gate terminal of the first PMOS transistor, and an output adapted to be coupled to a ground voltage supply;

a third PMOS transistor having an output terminal adapted to be coupled to the output terminal of the first PMOS transistor;

a fourth PMOS transistor having an output coupled to an input terminal of the third PMOS transistor;

a third NMOS transistor having an input terminal coupled to an input terminal of the third PMOS transistor and an enable coupled to a gate terminal of the third PMOS transistor (and a reference input);

a fourth NMOS transistor having an input terminal coupled to an output terminal of the third NMOS transistor, a gate terminal coupled to a gate terminal of the third PMOS transistor, and an output terminal coupled to the output of the second NMOS transistor;

a fifth PMOS transistor having an output terminal coupled to the input terminal of the first PMOS transistor;

a fifth NMOS transistor having an input terminal coupled to the input terminal of the fifth PMOS transistor and a gate terminal coupled to a gate terminal of the fifth PMOS transistor;

a first transmission gate having an input terminal coupled to the output of the fifth PMOS transistor;

a second transmission gate having an input terminal coupled to an output terminal of the first transmission gate and an output coupled to the input terminal of the second PMOS transistor;

a first circuit output terminal coupled to the input terminal of the second PMOS transistor;

a second circuit output terminal coupled to the input terminal of the fifth PMOS transistor;

a first circuit input terminal coupled to the gate terminal of the fifth PMOS transistor; and a second circuit input terminal coupled to the gate terminal of the fourth PMOS transistor.

20. A method of generating a full-swing digital signal from a small signal within an integrated circuit, the method comprising:

receiving an input small signal data signal containing common-mode noise and an input reference signal;

applying the input small signal data signal to a preamplifier having first and second current source transistors with their gate terminals coupled together;

varying the voltage applied to the gate terminals of the current source transistors to adjust the gain of the preamplifier to remove the common-mode noise from the input small signal data signal;

generating small signal output signals corresponding to the input small signal data signal;

amplifying the small signal output signals; and generating a full-scale digital high-frequency output signal.

21. The method of claim 20 wherein the input small signal data signal and the input reference signal are received from another integrated circuit.

22. A preamplifier, comprising:

a differential amplifier having first and second differential input terminals and first and second differential output terminals;

a first current source coupled to the differential amplifier and adapted to be coupled to a first voltage supply;

a second current source having an input terminal coupled to an input terminal of the first current source, the second current source coupled to the differential amplifier and adapted to be coupled to a second voltage supply;

two serially connected transistors having input terminals coupled together and adapted to be coupled to a reference voltage, the transistors being coupled to third and fourth current sources; and two serially connected resistive devices coupled between the differential outputs, a junction of the two resistors being coupled to a junction of the serially connected transistors and to the input terminals of the first and second current sources.

* * * * *

UNITED STATES PATENT AND TRADEMARK OFFICE
CERTIFICATE OF CORRECTION

PATENT NO.    : 5,939,942
DATED         : August 17, 1999
INVENTOR(S)   : Greason et al.

It is certified that error appears in the above-identified patent and that said Letters Patent is hereby corrected as shown below:

Column 1,
Line 6, delete "o" and insert -- to --.

Column 7,
Line 65, delete "Is".

Signed and Sealed this

Twenty-fifth Day of March, 2003

JAMES E. ROGAN
*Director of the United States Patent and Trademark Office*